US009167677B2

(12) United States Patent
Kim et al.

(10) Patent No.: US 9,167,677 B2
(45) Date of Patent: Oct. 20, 2015

(54) METHOD OF AGING X-RAY GENERATOR HAVING CARBON NANOTUBE ELECTRON EMITTER

(71) Applicant: Samsung Electronics Co., Ltd., Suwon-Si, Gyeonggi-Do (KR)

(72) Inventors: Do-yoon Kim, Hwaseong-si (KR); Il-hwan Kim, Yongin-si (KR); Shang-hyeun Park, Yongin-si (KR); Chang-soo Lee, Seoul (KR); Tae-won Jeong, Yongin-si (KR); Paul R. Schwoebel, Menlo Park, CA (US); Yong-chul Kim, Seoul (KR)

(73) Assignees: Samsung Electronics Co., Ltd., Gyeonggi-do (KR); SRI International, Menlo Park, CA (US)

( * ) Notice: Subject to any disclaimer, the term of this patent is extended or adjusted under 35 U.S.C. 154(b) by 0 days.

(21) Appl. No.: 14/455,167

(22) Filed: Aug. 8, 2014

(65) Prior Publication Data

US 2015/0071413 A1 Mar. 12, 2015

(30) Foreign Application Priority Data

Sep. 9, 2013 (KR) .................. 10-2013-0108059

(51) Int. Cl.
*H01J 9/04* (2006.01)
*H05G 1/32* (2006.01)
(Continued)

(52) U.S. Cl.
CPC *H05G 1/32* (2013.01); *H01J 9/045* (2013.01); *H01J 9/445* (2013.01); *H01J 35/065* (2013.01); *H01J 37/3491* (2013.01); *H01J 19/42* (2013.01); *H01J 29/485* (2013.01)

(58) Field of Classification Search
CPC .......... H01J 19/42; H01J 19/48; H01J 19/50; H01J 29/481; H01J 29/485; H01J 1/13; H01J 1/304; H01J 1/34; H01J 1/46; H01J 1/88; H01J 1/90; H01J 9/025; H01J 9/12; H01J 35/02; H01J 35/04; H01J 35/06; H01J 35/065; H01J 37/073; H01J 9/045; H01J 9/44; H01J 37/0735; B82Y 10/00; B82Y 40/00
USPC ........... 378/91, 113, 119, 122, 134, 135, 138, 378/210; 250/396 R, 397, 423 R, 423 F, 250/493.1, 494.1, 503.1, 526; 313/399, 313/409, 414–417, 446, 447, 452, 238, 243, 313/244, 252, 268, 292–302, 304, 310

See application file for complete search history.

(56) References Cited

U.S. PATENT DOCUMENTS

| 7,727,039 B2 | 6/2010 | Baik et al. | |
|---|---|---|---|
| 2003/0048057 A1* | 3/2003 | Oyama et al. | 313/311 |
| 2004/0085306 A1* | 5/2004 | Moon | 345/204 |
| 2008/0129177 A1* | 6/2008 | Wilson et al. | 313/309 |

FOREIGN PATENT DOCUMENTS

| KR | 20040037672 A | 5/2004 |
|---|---|---|
| KR | 20070107500 A | 11/2007 |

(Continued)

*Primary Examiner* — Anastasia Midkiff
(74) *Attorney, Agent, or Firm* — Harness, Dickey & Pierce

(57) ABSTRACT

Provided are methods of aging an x-ray generator having carbon nanotube electron emitters. The method of aging an x-ray generator that includes a cathode, a gate electrode, and an anode, includes applying a desired, or alternatively predetermined anode voltage to the anode, and applying a direct current pulse voltage to the gate electrodes to emit electrons from electron emitters. The method further includes maintaining an anode current formed by electrons generated from the electron emitters constant.

8 Claims, 4 Drawing Sheets

(51) Int. Cl.
*H01J 9/44* (2006.01)
*H01J 35/06* (2006.01)
*H01J 37/34* (2006.01)
*H01J 19/42* (2006.01)
*H01J 29/48* (2006.01)

(56) References Cited

FOREIGN PATENT DOCUMENTS

| KR | 100846503 B1 | 7/2008 |
| KR | 20110064864 A | 6/2011 |

\* cited by examiner

METHOD OF AGING X-RAY GENERATOR HAVING CARBON NANOTUBE ELECTRON EMITTER

CROSS-REFERENCE TO RELATED APPLICATIONS

This application claims priority from Korean Patent Application No. 10-2013-0108059, filed on Sep. 9, 2013, in the Korean Intellectual Property Office, the disclosure of which is incorporated herein in its entirety by reference.

BACKGROUND

1. Field

Example embodiments relate to methods of aging an x-ray generator having a carbon nanotube electron emitter.

2. Description of the Related Art

An x-ray generator generates x-rays by colliding electrons emitted from a cathode with an anode. An electron emitting source applied to an x-ray generator may be carbon nanotubes.

In an x-ray generator employed in mammography, an anode current is as high as approximately 100 mA. When a high current is irradiated on an anode, the anode may be damaged due to overheating of the anode. The anode current is a flow of the electrons emitted from the electron emitting source to the anode.

An electron emitter of a carbon nanotube x-ray generator is typically formed by printing a plurality of carbon nanotubes with a polymer and a binder on a cathode. Therefore, the heights of the carbon nanotubes may not be uniform. When the anode current of approximately 100 mA is generated by applying an electric field to the carbon nanotube x-ray generator, the electric field may be concentrated on some of the carbon nanotubes due to the non-uniformity of the height of the carbon nanotubes, and thus, the function of the electron emitter may be damaged.

Also, in order to discharge gases generated from the polymer or the binder included in the electron emitter to the outside of the carbon nanotube x-ray generator, an aging of the carbon nanotube x-ray generator is needed.

SUMMARY

Example embodiments relate to methods of aging an x-ray generator having an electron emitter in which carbon nanotubes have a uniform height.

Additional example embodiments will be set forth in part in the description which follows and, in part, will be apparent from the description, or may be learned by practice of the example embodiments.

According to at least one example embodiment, there is provided a method of aging an x-ray generator having carbon nanotube electron emitters including a cathode on which a plurality of electron emitters are formed, an anode facing the cathode, a plurality of spacers disposed on the cathode, a gate electrode on the plurality of spacers, and charge prevention films that cover the plurality of spacers, the method including applying a desired, or alternatively predetermined anode voltage to the anode, and applying a direct current pulse voltage to the gate electrode to emit electrons from the electron emitters.

The example method may further include maintaining an anode current formed by electrons generated from the electron emitters constant.

A duty ratio of the direct current pulse voltage may be 5-20%.

The maintaining of the anode current constant may include reducing the anode voltage sequentially or in a stepwise manner.

The maintaining of the anode current constant may include reducing the duty ratio sequentially or in a stepwise manner.

The maintaining of the anode current constant may include maintaining the anode current at approximately 25-35 mA.

A duration of the direct current pulse voltage may be 0.1-10 seconds.

BRIEF DESCRIPTION OF THE DRAWINGS

These and/or other example embodiments will become apparent and more readily appreciated from the following description of the example embodiments, taken in conjunction with the accompanying drawings in which.

DETAILED DESCRIPTION

Figure 1:
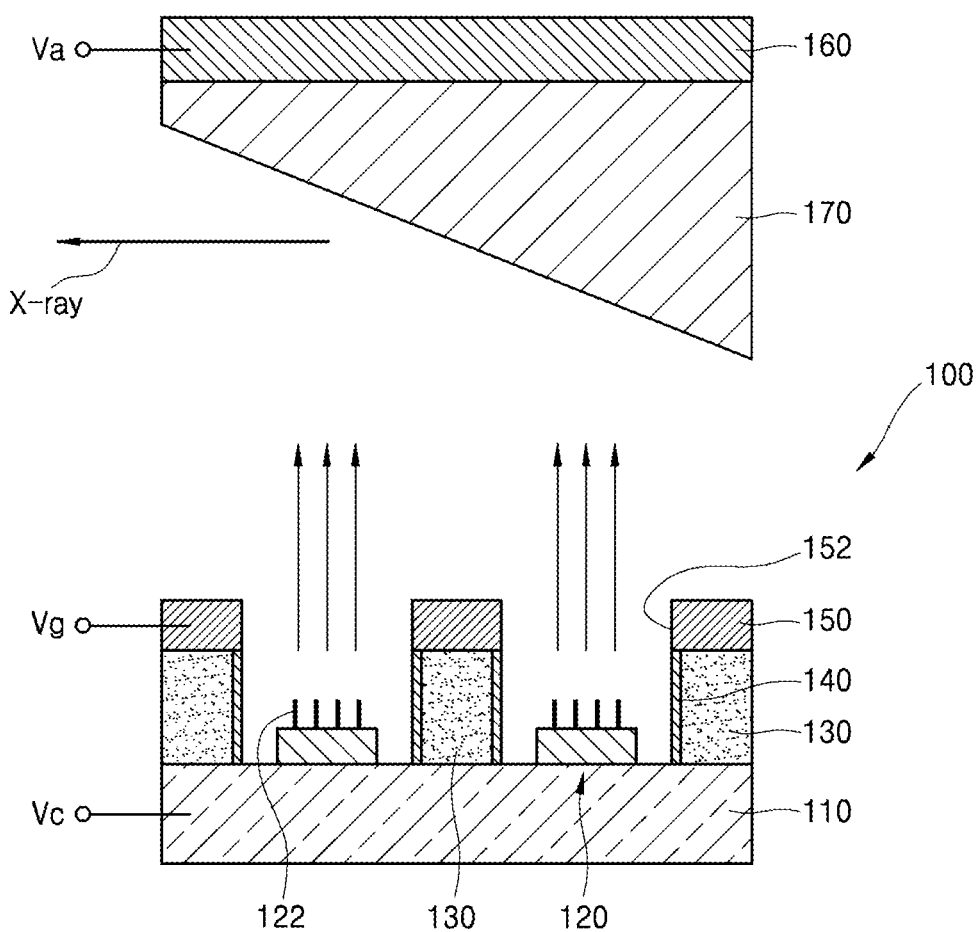
FIG. 1 a schematic drawing of an x-ray generator having a carbon nanotube electron emitter to which an aging method according to example embodiments is applied.

Example embodiments will now be described more fully with reference to the accompanying drawings, in which example embodiments are shown. In the drawings, the thicknesses of layers and regions are exaggerated for clarity. The example embodiments may be embodied in many different forms.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

FIG. 1 a schematic drawing of an x-ray generator 100 having a carbon nanotube electron emitter to which an aging method according to example embodiments is applied.

According to various example embodiments, referring to FIG. 1, a plurality of spacers 130 are disposed on a cathode 110. Electron emitters 120 are disposed on a top surface of the cathode 110 that is exposed by the spacers 130. The electron emitters 120 include carbon nanotubes 122. A gate electrode 150 is formed on the spacers 130. The gate electrode 150 may be a grid electrode in which a plurality of openings 152 are formed in an array. The electron emitters 120 may be formed in a plurality of shapes, and in FIG. 1, two rectangular electron emitters 120 are depicted for convenience.

According to various example embodiments, an anode 160 is disposed above the cathode 110. A target 170 is disposed on a surface of the anode 160 facing the cathode 110. Electrons emitted from the carbon nanotubes 122 move towards the anode 160, and the flow of electrons may be referred to as an anode current. The anode current may be as high as approximately 100 mA in an x-ray generator applied to, for example, mammographies.

Electrons moving towards the anode 160 collide with the target 170, and x-rays are generated from the target 170. The target 170 may be formed of a metal, such as Mo, Ag, W, Cr, Fe, Co, and Cu, or a metal alloy thereof. A focusing lens may further be disposed between the target 170 and the gate electrode 150.

A charge prevention film 140 may be formed on a sidewall of the spacer 130. The charge prevention film 140 may also be formed on an upper surface of the spacer 130. Also, the charge prevention film 140 may be formed to cover the spacer 130, and may be formed on the cathode 110 to surround the electron emitter 120. The charge prevention film 140 may have a thickness of approximately 500 Å or less. If the thickness of the charge prevention film 140 is greater than about 500 Å, then the charge prevention film 140 may become more conductive.

The charge prevention film 140 may be formed of a material having a specific resistance $\rho$ between a specific resistance of the spacers 130 and a specific resistance of the gate electrode 150. The value of the specific resistance $\rho$ may be determined by a thickness t of the charge prevention film 140 to be coated and an amount of leakage current I that is tolerated in an electron emitting device between the cathode 110 and the gate electrode 150, and is calculated from Ohm's law as expressed as Equation 1.

$$I = V/R = V/(\rho \times h/t) \qquad \text{[Equation 1]}$$

In Equation 1, V is a gate voltage applied between the cathode 110 and the gate electrode 150, and h is a height of the spacers 130. For example, the specific resistance $\rho$ of the charge prevention film 140 may be greater than $10^7$ $\Omega$cm and less than $10^{10}$ $\Omega$cm. A material for forming the charge prevention film 140 may be amorphous silicon (a-Si), $Cr_2O_3$, TaN, $RuO_2$, PbO, NiCr, or $Bi_2Ru_2O_7$.

Electrons emitted from the electron emitter 120 are generally emitted through the openings 152 in the gate electrode 150. However, some of the electrons emitted from the electron emitter 120 may enter into the charge prevention film 140. Since the specific resistance ρ of the charge prevention film 140 is less than the specific resistance of the spacers 130, and greater than the specific resistance of the gate electrode 150, the electrons that enter into the charge prevention film 140 move to the gate electrode 150 having a high electric potential. Accordingly, the accumulation of charges on the spacers 130 may be reduced or prevented, and arcing is reduced.

A cathode voltage Vc may be a ground voltage, a gate voltage Vg of approximately 200-400 V may be applied to the gate electrode 150, and an anode voltage Va of approximately 30-50 kV may be applied to the anode 160. The anode current is as high as approximately 100 mA, and when the anode current is continuously irradiated onto the target 170, the target 170 may be damaged due to heat. Practically, in mammography, the anode current is irradiated for approximately 0.01-1 second per radiation.

The electron emitter 120 that includes the plurality of carbon nanotubes 122 is approximately perpendicularly arranged with respect to a surface the cathode 110. The carbon nanotubes 122 are exposed or provided on a surface of the electron emitter 120 via a process of drying, sintering, and activating the carbon nanotubes 122 after coating a paste of carbon nanotubes on the cathode 110. During the activating process, the height of the carbon nanotubes 122 may not be uniform. When the carbon nanotubes 122 have a non-uniform height, an electric field may be concentrated on the carbon nanotubes 122 having a taller height than other carbon nanotubes, and thus, arcing may easily occur. An aging is necessary for out-gassing and prevention of the arcing.

Figure 2:
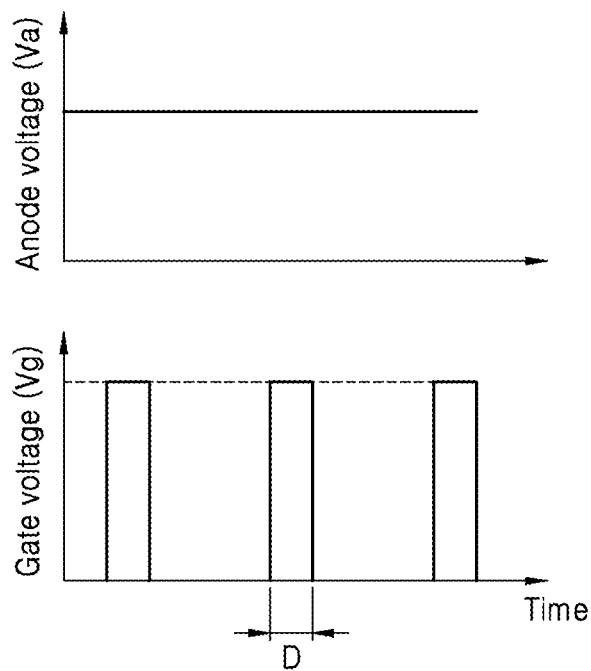
FIG. 2 is a voltage versus time graph for explaining aging of an x-ray generator having a carbon nanotube electron emitter according to example embodiments.

FIG. 2 is a voltage versus time graph for explaining an aging of an x-ray generator having a carbon nanotube electron emitter according to example embodiments. Like reference numerals are used to indicate elements that are substantially identical to the elements of FIG. 1, and a detailed description thereof will not be repeated.

Referring to FIG. 2, when a desired, or alternatively predetermined anode voltage Va is applied to the anode 160, a gate voltage Vg is applied. At this point, a ground voltage may be applied to the cathode 110. The anode voltage Va is a voltage difference between the anode 160 and the cathode 110, and the gate voltage Vg is a voltage difference between the gate electrode 150 and the cathode 110. The anode voltage Va used in the x-ray generator 100 may be approximately 30-50 kV, and the anode voltage Va used for aging may be approximately 3-5 kV in order to protect the device. The gate voltage Vg used in the x-ray generator 100 is approximately 200-400 V. The gate voltage Vg for aging may be the same as the gate voltage Vg used for the carbon nanotube x-ray generator.

The gate voltage Vg causes the carbon nanotubes 122 on the cathode 110 to emit electrons. The actual gate voltage Vg that is used to cause the carbon nanotubes 122 to emit electrons may vary at least partly according to a height of the spacers 130.

An anode current during aging may be at a level of approximately 25-35 mA in order to avoid damaging the device.

As it is shown in FIG. 2, the gate voltage Vg applied for aging is a direct current pulse voltage. When a direct current pulse voltage is applied to the gate electrode 150, electrons are emitted from the electron emitter 120. The application of the direct current pulse voltage as the gate voltage Vg is performed to emit electrons from the electron emitter 120. When the gate voltage Vg is continuously or substantially continuously applied to the target 170, the temperature of the target 170 on the anode 160 is increased by the continuous or substantially continuous anode current, and as a result the target 170 may be damaged. Therefore, to avoid damage to the target 170, the direct current pulse voltage is applied to the gate electrode 150. A duty ratio of the direct current pulse voltage of the gate voltage Vg may be approximately 5-20%. If the duty ratio is less than 5%, the aging time is increased. If the duty ratio is greater than 20%, the carbon nanotubes 122 may be burnt out, and thus, the carbon nanotubes 122 may lose their function. Furthermore, the target 170 may be damaged due to the increased temperature of the target 170.

A single pulse duration D of the gate voltage Vg may be approximately 0.1-10 seconds.

When a direct current is applied to the gate electrode 150 during the aging process, electrons emitted from the electron emitter 120 may accumulate on a side surface of the spacer 130, and as a result, arcing may occur. However, in at least one example embodiment, the charge prevention film 140 is formed on the side surface of the spacer 130, and thus, the accumulation of the electrons on the spacer 130 is reduced or prevented. Accordingly, arcing may be reduced or prevented although a direct current pulse voltage is applied to the gate electrode 150.

Gases generated during the process of aging are evacuated via exhaust by using a vacuum pump. When the aging is completed, the x-ray generator 100 is encapsulated to maintain a high vacuum state.

In an example embodiment, the application of the direct current pulse voltage to the gate electrode 150 may be performed by applying a pulse signal to an element which supplies a direct current voltage to the gate electrode 150.

The aging process of the x-ray generator 100 may be performed for approximately 4 hours. Due to the aging, taller carbon nanotubes 122 are damaged due to the concentration of an electric field, and may thus lose their electron emission function. When this process is performed, the height of the carbon nanotubes 122 becomes uniform, and accordingly, the distribution of electrons travelling towards the anode 160 becomes uniform.

Figure 3:
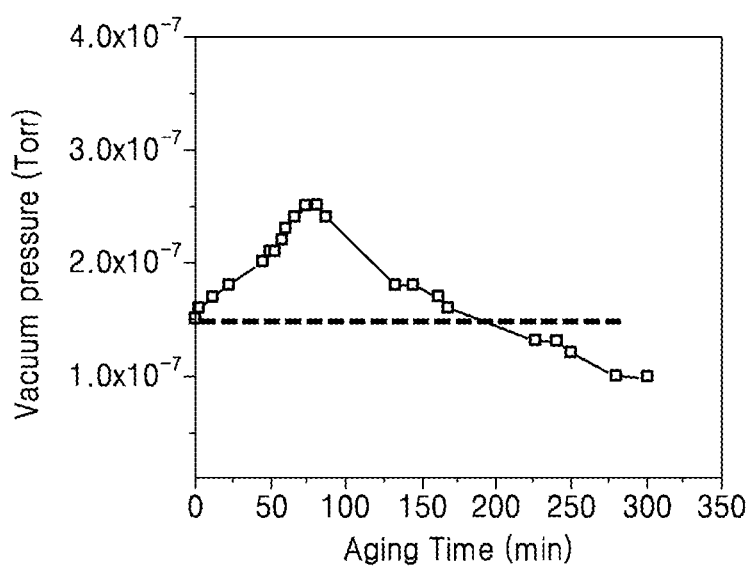
FIG. 3 is a graph showing a variation of pressure according to aging time in an x-ray generator to which an aging method according to example embodiments is applied.

FIG. 3 is a graph showing a variation of pressure according to aging time in an x-ray generator to which a method of aging x-ray generator according to example embodiments is applied. The aging was performed with an anode voltage Va of 3 kV and a gate voltage Vg of 230 V with a duty ratio of 10%, and an anode current was 30 mA.

According to the aging time, pressure is increased at an early stage due to the generation of outgases. However, after approximately 200 minutes, the pressure is reduced below the initial pressure. From this result, it is assumed that the aging time of approximately 4 hours may be appropriate.

Figure 4:
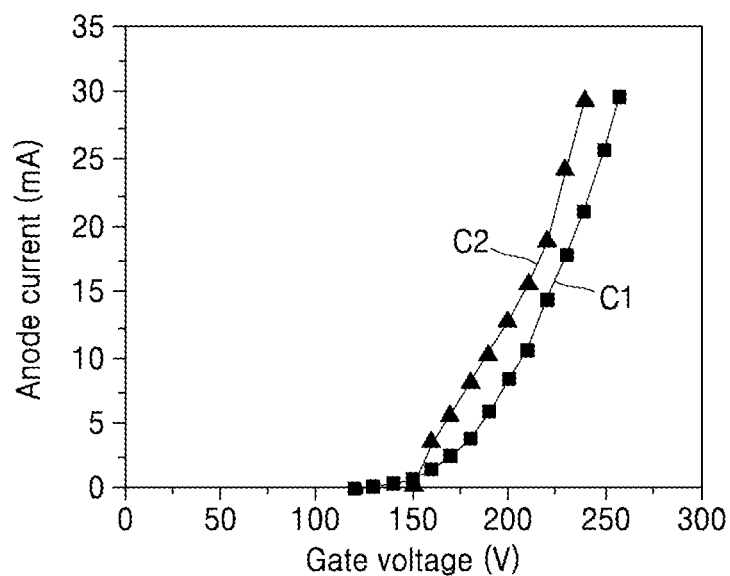
FIG. 4 is a graph showing a comparative chart illustrating electric field emission characteristics according to aging.

FIG. 4 is a graph showing a comparison of electric field emission characteristics according to aging. A first curve C1 shows a current characteristic of an x-ray generator that is not aged, and a second curve C2 shows a current characteristic of an x-ray generator that is aged according to an example embodiment. For aging, an anode voltage Va of 3 kV and a gate voltage Vg of 230 V with a duty ratio of 10% was supplied. The aging was performed for 4 hours.

Referring to FIG. 4, as the gate voltage increases to a value greater than 150 V, the anode current was measured. When the second curve C2 is compared with the first curve C1, a large increase in the anode current is observed in the second curve C2 compared to the first curve C1. Accordingly, an electric emission effect is increased due to aging.

Figure 5:
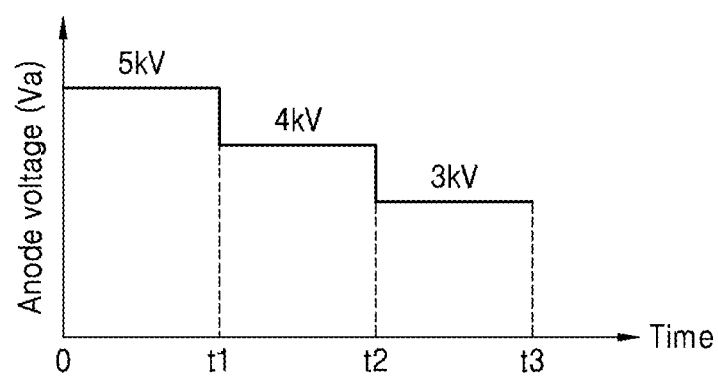
FIG. 5 is a voltage versus time graph for explaining aging of an x-ray generator having a carbon nanotube electron emitter according to example embodiments.

FIG. 5 is a voltage versus time graph for explaining aging of an x-ray generator having a carbon nanotube electron emitter according to example embodiments.

The aging may be divided into multiple stages. In FIG. 5, for convenience, the aging is divided into three (3) stages. The anode voltage Va in three intervals (0-t1, t1-t2, and t2-t3) were sequentially reduced.

During the first step of aging (in the interval 0-t1), since electrons are emitted from a relatively small number of tall carbon nanotubes 122, the amount of emitted electrons is small. Therefore, a desired value of anode current is obtained by applying a relatively high anode voltage Va, for example, 5 kV. In the first step of aging, an electric field is typically concentrated on relatively tall carbon nanotubes 122. As a result, the height of the relatively tall carbon nanotubes 122 is reduced or the relatively taller carbon nanotubes 122 are burnt out or otherwise damaged.

When the height of the carbon nanotubes 122 is more uniform according to increasing aging time, the amount of electron emission is increased, and thus, the anode current may be gradually increased. Accordingly, in the second step of aging (in the interval t1-t2) and the third step of aging (in the interval t2-t3), the anode voltage Va is gradually reduced. For example, during the second step of aging, an anode voltage Va of 4 kV is applied, and during the third step of aging, an anode voltage Va of 3 kV is applied. Accordingly, in order to maintain a constant anode current over time during the aging process, the anode voltage Va is gradually reduced in a stepwise manner.

However, the example embodiments are not limited thereto. That is, instead of reducing the anode voltage Va in a stepwise manner, the anode current may be maintained at a constant value by sequentially reducing a duty ratio of the gate voltage Vg while maintaining the anode voltage Va constant.

Figure 6:
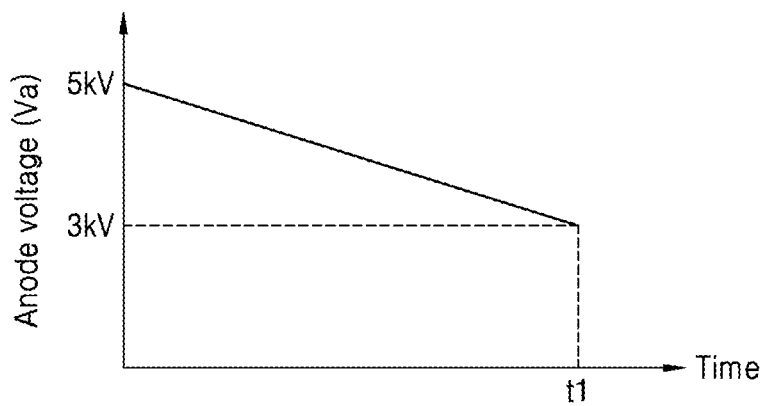
FIG. 6 is a voltage versus time graph for explaining aging of an x-ray generator having a carbon nanotube electron emitter according to example embodiments

FIG. 6 is a voltage versus time graph for explaining aging of a carbon nanotube x-ray generator having a carbon nanotube electron emitter according to example embodiments.

During the process of aging, an anode current increases while the height of the carbon nanotubes 122 becomes uniform. Accordingly, in order to maintain a constant anode current, the anode voltage Va is continuously or substantially continuously reduced at a desired, or alternatively predetermined, ratio. In an initial stage of aging during an interval 0-t1, an anode voltage Va of 5 kV is applied, and next, the anode voltage Va is continuously or substantially continuously reduced according to a desired, or alternatively predetermined schedule, and at the end of aging t1, an anode voltage Va of 3 kV is applied. As a result of the consecutive reduction of the anode voltage Va, an anode current may be maintained constant during an aging process, and accordingly, an aging time may be reduced while protecting the target 170 on the anode 160.

However, the example embodiments are not limited thereto. That is, instead of consecutively reducing the anode voltage Va, the anode current may be maintained at a constant value by sequentially reducing a duty ratio of the gate voltage Vg while maintaining the anode voltage Va constant.

According to the example method of aging a carbon nanotube x-ray generator having a carbon nanotube electron emitter, since a direct current pulse voltage is applied to a gate electrode, a supply of an electron generation voltage is facilitated when compared to the application of an alternative current pulse voltage to the gate electrode.

Also, since an anode current that flows towards the anode can be maintained substantially constant, damage to the target on the anode may be reduced or prevented even if a long aging process is performed.

Through the aging, the lifetime of a carbon nanotube x-ray generator may be increased, and a detection of x-rays may be stabilized by the supply of a constant anode current.

It should be understood that the example embodiments described therein should be considered in a descriptive sense only and not for purposes of limitation. Descriptions of features or aspects within each example embodiment should typically be considered as available for other similar features in other example embodiments.

What is claimed is:

1. A method of aging an x-ray generator, the x-ray generator having carbon nanotube electron emitters and including a cathode on which a plurality of electron emitters are formed, an anode facing the cathode, a target on the anode facing the plurality of electron emitters to emit an x-ray, a plurality of spacers on the cathode to expose the plurality of electron emitters, a gate electrode on the plurality of spacers, and charge prevention films covering the plurality of spacers, the method comprising:
    applying a desired substantially continuous anode voltage to the anode and maintaining a constant anode current formed by electrons generated from the electron emitters; and
    applying a direct current pulse voltage to the gate electrode to emit electrons from the electron emitters;
    wherein the maintaining the constant anode current includes reducing the anode voltage sequentially or in a stepwise manner.

2. The method of claim 1, wherein a duty ratio of the direct current pulse voltage is about 5-20%.

3. The method of claim 1, wherein the maintaining of the constant anode current comprises maintaining the anode current at about 25-35mA.

4. The method of claim 1, wherein a duration of the applying the direct current pulse voltage is about 0.1-10 seconds.

5. A method of aging an x-ray generator, the x-ray generator having carbon nanotube electron emitters and including a cathode on which a plurality of electron emitters are formed, an anode facing the cathode, a target on the anode facing the plurality of electron emitters to emit an x-ray, a plurality of spacers on the cathode to expose the plurality of electron emitters, a gate electrode on the plurality of spacers, and charge prevention films covering the plurality of spacers, the method comprising:
    applying a desired substantially continuous anode voltage to the anode and maintaining a constant anode current formed by electrons generated from the electron emitters; and
    applying a direct current pulse voltage to the gate electrode to emit electrons from the electron emitters,
    wherein the maintaining the constant anode current includes reducing the duty ratio sequentially or in a stepwise manner.

6. The method of claim 5, wherein a duty ratio of the direct current pulse voltage is about 5-20%.

7. The method of claim 5, wherein the maintaining of the constant anode current comprises maintaining the anode current at about 25-35 mA.

8. The method of claim 5, wherein a duration of the applying the direct current pulse voltage is about 0.1-10 seconds.

* * * * *